US012566122B2

(12) United States Patent
    Hök et al.

(10) Patent No.: US 12,566,122 B2
(45) Date of Patent: Mar. 3, 2026

(54) GAS DETECTING DEVICE

(71) Applicants: SENSEAIR AB, Delsbo (SE); ASAHI KASEI MICRODEVICES CORPORATION, Tokyo (JP)

(72) Inventors: Bertil Hök, Västerås (SE); Jonas Ljungblad, Västerås (SE); Hiromi Fujita, Tokyo (JP); Tatsushi Yagi, Tokyo (JP); Floria Ottonello Briano, Stockholm (SE)

(73) Assignees: SENSEAIR AB, Delsbo (SE); ASAHI KASEI MICRODEVICES CORPORATION, Tokyo (JP)

( * ) Notice: Subject to any disclaimer, the term of this patent is extended or adjusted under 35 U.S.C. 154(b) by 0 days.

(21) Appl. No.: 18/856,590

(22) PCT Filed: Apr. 11, 2023

(86) PCT No.: PCT/SE2023/050329
    § 371 (c)(1),
    (2) Date: Oct. 11, 2024

(87) PCT Pub. No.: WO2023/200385
    PCT Pub. Date: Oct. 19, 2023

(65) Prior Publication Data
    US 2025/0172479 A1      May 29, 2025

(30) Foreign Application Priority Data

Apr. 13, 2022    (SE) .................................... 2250458-3

(51) Int. Cl.
    *G01N 15/075*       (2024.01)
    *G01N 21/3504*      (2014.01)
    (Continued)

(52) U.S. Cl.
    CPC ....... *G01N 15/075* (2024.01); *G01N 21/3504* (2013.01); *H10F 30/2215* (2025.01);
    (Continued)

(58) Field of Classification Search
    CPC ............. G01N 15/075; G01N 21/3504; G01N 21/552; G01N 2201/06113; G01N 2201/0636; H10F 30/2215; H10F 71/1272
    See application file for complete search history.

(56) References Cited

U.S. PATENT DOCUMENTS 7,973,924 B2     7/2011  Noda et al.
    2009/0126460 A1*  5/2009  Gardner ............. G01N 33/0047
                                                        257/253
    (Continued)

FOREIGN PATENT DOCUMENTS

CN        119522364  A      2/2025
    WO     WO-2015/059109 A1    4/2015
    WO     WO-2021/066721 A1    4/2021

OTHER PUBLICATIONS

International Preliminary Report on Patentability, International Application No. PCT/SE2023/050329, dated Feb. 13, 2024.
    (Continued)

*Primary Examiner* — Hina F Ayub
(74) *Attorney, Agent, or Firm* — MARSHALL, GERSTEIN & BORUN LLP

(57)                    ABSTRACT

Gas detecting devices and in particular volatile substance sensors such as breath alcohol devices sensors. The semiconductor gas sensor device includes a laser structure and an optical waveguide resonator formed in a same compound semiconductor which includes at least one optical emission layer and one optical propagation layer. The optical waveguide resonator is formed in the optical propagation layer and is to its greater part separated from the remaining portion of the optical propagation layer. The laser structure
    (Continued)

Page 2 is provided adjacent to a portion of the optical waveguide resonator and arranged to transmit electromagnetic radiation at a specific wavelength band to the optical waveguide resonator arranged to resonate at that specific wavelength band.

20 Claims, 15 Drawing Sheets

(51) Int. Cl.
　　*H10F 30/221*　　　(2025.01)
　　*H10F 71/00*　　　(2025.01)
(52) U.S. Cl.
　　CPC .............. *G01N 2201/06113* (2013.01); *G01N 2201/0636* (2013.01); *H10F 71/1272* (2025.01)

(56)　　　　　　References Cited

U.S. PATENT DOCUMENTS

| | | | |
|---|---|---|---|
| 2012/0007099 A1* | 1/2012 | Liu ...................... | G01N 27/125 |
| | | | 257/E29.166 |
| 2016/0282265 A1 | 9/2016 | Su et al. | |
| 2020/0018701 A1 | 1/2020 | Meyer et al. | |

OTHER PUBLICATIONS

Yan et al., "Precise Chemical Sensing via External Cavity Lasing Technology", IEEE Photonic Technology Letters, IEEE, USA, 32:20, 1287-1290 (2020).
Edinger et al., "Compact Low Loss MEMS Phase Shifters for Scalable Field-Programmable Silicon Photonics", 2020 Conference on Lasers and Electro-Optics (CLEO), (2020).
Hök et al., "Batch Fabrication of Micromechanical Elements in GaAs—AlxGa1—xAs", Sensors and Actuators 4, 341-348 (1983).
Lindén et al., "Fabrication of Three-Dimensional Silicon Structures By Means of Doping-Selective Etching (DSE)", Sensors and Actuators 16, 67-82 (1989).
Tenerz et al., "Micromachining of Three-Dimensional Structures Using Photo-Electrochemical Etching", Electronics Letters, 21, 1207-1208 (1985).
John U. White, "Long Optical Paths of Large Aperture", Journal of the Optical Society of America, vol. 32, 285-288 (1942).
Office Action, Chinese Patent Application No. 202380033457.X, dated Apr. 9, 2025.
International Search Report and Written Opinion, International Application No. PCT/SE2023/050330, dated May 25, 2023.
Passaro et al., "Recent Advances in Integrated Photonic Sensors", Sensors, 12:12, 15558-15598 (2012).
International Search Report and Written Opinion, International Application No. PCT/SE2023/050329, dated May 22, 2023.
Notification of Transmittal of the International Preliminary Report on Patentability, International Application No. PCT/SE2023/050330, dated Jul. 17, 2024.
Notification of Transmittal of the International Preliminary Report on Patentability, International Application No. PCT/SE2023/050329, dated Feb. 13, 2024.
Lacker et al., "CO and CO2 spectroscopy using a 60 nm broadband tunable MEMS-VCSEL at ~1.55 μm", Optics Letters, 31:21, 3170-3172 (2006).
Communication under Rule 71(3) EPC, European Application No. 23718081.5, dated Oct. 15, 2025.
Lackner et al., "CO and CO2 spectroscopy using a 60 nm broadband tunable MEMS-VCSEL at ~1.55 μm", Optical Society of America, vol. 31, No. 21, 3170-3172 (2006).

* cited by examiner 405
404
403
402
401
406

GAS DETECTING DEVICE

TECHNICAL FIELD

The present invention relates to gas detecting devices and in particular to volatile substance sensors such as breath alcohol devices, handheld devices for mobile use, stationary or mobile environmental monitoring devices, instruments for medical diagnostics and patient monitoring, vehicle monitoring devices and systems, industrial processing equipment, and household appliances.

In particular, the invention relates to miniaturized semiconductor sensors and systems where small physical size, robustness, low production cost, and low power consumption is important.

BACKGROUND

Gas detecting devices that are used to detect volatile substance in air or a breath sample need to combine very high sensitivity with reliability and preferably a short measurement and analysis time. In addition, there is a desire to provide such detecting devices in high numbers to promote widespread use. Therefore, affordable solutions are highly sought for.

One example of the use of gas detecting devices wherein all the above requirements are present is within the area of breath alcohol testing. In the area evidential breath testers are utilized to provide legal proof of illegal concentrations of primarily alcohol in a person's blood (and breath); vehicle based testers and stationary work place testers are used to prohibit a person under the influence of for example alcohol to drive and/or to enter a dangerous workplace; and cheaper consumer test units are used by individuals to control their level of intoxication. Evidential breath testers are typically based on spectrophotometer technology and are typically large, expensive and consumes a relatively large amount of power during operation. Such devices provide a very high accuracy, but the technology is not suitable for consumer products such as handheld or vehicle mounted products.

Many handheld breath analyzers sold to consumers use semiconducting metal oxide sensors to determine the blood alcohol concentration. These sensors are prone to contamination and interference from substances other than breath alcohol. The sensors require recalibration or replacement every six months. Higher-end personal breath analyzers and professional-use breath alcohol testers use platinum fuel cell sensors. These too require recalibration but at less frequent intervals than semiconductor devices, usually once a year.

One type of spectroscopic sensors have been commercialized as vehicle mounted breath analyzers and stationary breath analyzers, the Multipass spectroscopic absorption cells. The term "multipass" refers to letting electromagnetic irradiation reflect, preferably multiple times within measuring cell in order to increase the optical path and thereby the sensitivity of a sensor, or measuring system, which the cell is a part of. A particularly useful implementation of a multipass cell is the so called White-cell, proposed by John U White as early as 1942 (Journal of the Optical Society of America, 1942) and used since then. Breath analyzers based on White-cells represents significant improvements in size and cost compared to other spectrophotometer based sensors and in accuracy and reliability compared to silicon oxide sensor and other consumer products. However, the technology is difficult to further miniaturize and the optical arrangements will always make these sensors more costly than sensors based purely on semiconductor technology. These problems are not limited to detectors used for alcohol testing. Rather, similar requirements can be found in all areas wherein there is a need to determine the concentration, typically a very small concentration, of a specific volatile substance, for example in the areas of environmental monitoring, medical diagnostics and patient monitoring and vehicle monitoring.

SUMMARY

The object of the present invention is to overcome the drawbacks associated with prior art gas sensor devices. This is achieved by the semiconductor gas sensor device defined by the independent claim.

According to a first aspect, a semiconductor gas sensor device for determining the concentration of a volatile substance within an airflow is provided. The semiconductor gas sensor device comprises a laser structure and an optical waveguide resonator formed in a same compound semiconductor and a means for detecting optical power dissipation of an electromagnetic wave propagating in the optical waveguide resonator. The compound semiconductor comprises a single crystalline substrate and a plurality of epitaxially grown semiconductor single crystalline layers provided on the substrate, wherein the plurality of epitaxially grown semiconductor single crystalline layers comprises at least one optical emission layer and one optical propagation layer. The optical emission layer is present at least in the laser structure and is arranged to emit electromagnetic radiation within a specific wavelength band. The optical waveguide resonator is at least partly constituted by one part of the optical propagation layer and to its greater part separated from the remaining part of the optical propagation layer so that it optically can be regarded as a free-hanging unit. The optical waveguide resonator is arranged to resonate in the specific wavelength band. The laser structure is provided adjacent to a portion of the optical waveguide resonator, thereby providing means for transmitting electromagnetic radiation within the specific wavelength band generated in the optical emission layer of the laser structure to the optical waveguide resonator.

The position and width of the specific wavelength band are thus determined by specific properties of both the emission layer and the waveguide resonator, which are related by optical feedback, and by drive voltage. In each case, both the position and the width of the specific wavelength band are matched to the peak wavelength and width or quality factor of an absorption peak of the target substance.

According to one embodiment, the laser structure comprises a laser waveguide, which is at least partly formed in, or otherwise optically coupled to, the optical propagation layer and wherein during use the laser waveguide is optically coupled to the optical waveguide resonator.

According to one embodiment, the semiconductor gas sensor device is arranged to determine a concentration of a substance in air and the laser structure is arranged to emit electromagnetic radiation at the specific wavelength band, and the optical waveguide resonator arranged to resonate at the specific wavelength band, associated with a peak in absorbance of the specific substance.

According to one embodiment, the laser structure is arranged adjacent to a portion of the optical waveguide resonator with a gap which does not exceed $\frac{1}{2}$ of a wavelength in the specific wavelength band, preferably not exceeding $\frac{1}{4}$ of a wavelength in the specific wavelength band.

According to one embodiment, the material of the optical propagation layer is selected to be highly transparent in the specific wavelength band.

According to one embodiment, the optical waveguide resonator is dimensioned so that its circumference $C_r$ will precisely equal an integer N times the desired resonance wavelength $\lambda_r$ corresponding to the absorption peak wavelength of the substance to be detected.

According to one embodiment, the optical waveguide resonator is a closed-loop structure. The closed-looped structure may, for example, be ring-formed.

According to one embodiment, the optical waveguide resonator is a line-formed structure and comprises a first reflector and a second reflector arranged at each end of the optical waveguide resonator.

According to one embodiment, the optical waveguide resonator is ring-formed.

According to one embodiment the optical waveguide resonator is provided with at least one straight portion positioned adjacent to the laser structure and the length of the straight portion is at least as long as the extension of the laser structure in the plane of the compound semiconductor with the objective of minimizing optical loss while maximizing the optical coupling efficiency between the laser structure and the waveguide resonator.

According to one embodiment the plurality of layers comprises at least one intermediate layer arranged in between the substrate and the optical propagation layer, the intermediate layer being present beneath the optical propagation layer in the laser structure and the intermediate layer being at least partly absent under the optical propagation layer forming the optical waveguide resonator.

According to one embodiment, the optical waveguide resonator is partly free hanging over etched-away portions of the intermediate layer and partly supported by remaining structures of the intermediate layer.

According to one embodiment, the optical waveguide resonator is partly free hanging over etched-away portions of the intermediate layer and partly supported by a plurality of bridges provided in the optical propagation layer and extending from a base structure to the optical waveguide resonator. The bridges preferably have a width that is less than the shortest wavelength in the specific wavelength band and preferably less than 1 μm.

According to one embodiment, the optical waveguide resonator (106) has an essentially rectangular cross section with width/thickness of approximately 2.0±0.5/0.2±0.1 μm.

According to one embodiment, the laser structure is utilized to measure the concentration of the volatile substance and the semiconductor gas sensor device further comprises means for monitoring and controlling the current and voltage of the laser structure during use. The laser structure may be implemented as for example a double heterostructure laser or a quantum cascade laser.

According to one embodiment, the semiconductor gas sensor device further comprises a MEMS modulator formed at least partly in the optical propagation layer and arranged to control the position of the specific wavelength band, henceforth referred to as wavelength modulation.

According to one embodiment, the semiconductor gas sensor device further comprises optical feedback gratings formed at least partly in the optical propagation layer.

According to one embodiment the semiconductor gas sensor device further comprises a photodiode formed at least partly by the plurality of epitaxially crystal grown layers.

According to one embodiment the semiconductor gas sensor device further comprises a temperature sensor formed at least partly by the plurality of epitaxially crystal grown layers.

According to one aspect of the invention a gas detecting system comprising the semiconductor gas sensor device described above and an electronic unit to be in electrical connection with at least the laser structure of the gas sensor device and controlling the gas sensor device. The electronic unit may be arranged to supply a modulating voltage superimposed on a DC drive voltage to the laser structure thereby providing an electronic modulation of the electromagnetic wave in the optical waveguide resonator and thereby a modulation of the specific wavelength band of the electromagnetic wave in the waveguide resonator in addition to, or as an alternative to, the MEMS modulation mentioned before. Two different options for wavelength modulation, the sideways movement of the wavelength band across the substance absorption peak, are thus provided.

According to one embodiment, the electronic unit is arranged to be in electrical connection with at least the laser structure and the photodiode of the gas sensor device.

According to one aspect of the invention a method of determining the concentration of a volatile substance within an airflow utilizing the gas detecting system described above is provided. The method comprises the steps:

providing a gas detecting system;

providing an air-flow to the immediate surroundings of the semiconductor gas sensor device of the gas detecting system;

supplying a drive voltage to the laser structure of the semiconductor gas sensor device; and recording the output from the means for detecting relating to the optical power dissipation of an electromagnetic wave propagating in the optical waveguide resonator being affected by volatile substance within an air flow.

According to one embodiment the laser structure is utilized not only to generate the electromagnetic radiation, but also to detect the optical power dissipation caused by the interaction with the volatile substance, by monitoring and controlling the current and voltage of the laser structure and basing the determination of the concentration of a volatile substance on how the current-voltage characteristic of the laser structure is influenced by the volatile substance within the air-flow. Alternatively, the method comprises monitoring and analyzing the output from a photodiode detecting the optical power dissipation in the optical waveguide resonator.

Thanks to the invention gas sensor devices based on a semiconductor gas sensor device provided on one chip may be provided. This has large advantages in terms of miniaturization, production cost, sensitivity, power consumption and reliability. Compared to prior art semiconductor device utilizing an optical waveguide the present invention provides a much more reliable and efficient optical coupling between the light source, for example a laser structure and the optical waveguide resonator since both these structures are formed in the same semiconductor multilayered structure.

Many additional benefits and advantages of the present invention will be readily understood by the skilled person in view of the detailed description below and accompanying drawings.

BRIEF DESCRIPTION OF THE DRAWINGS

The invention will now be described in more detail with reference to the appended drawings, wherein.

Figure 1A:
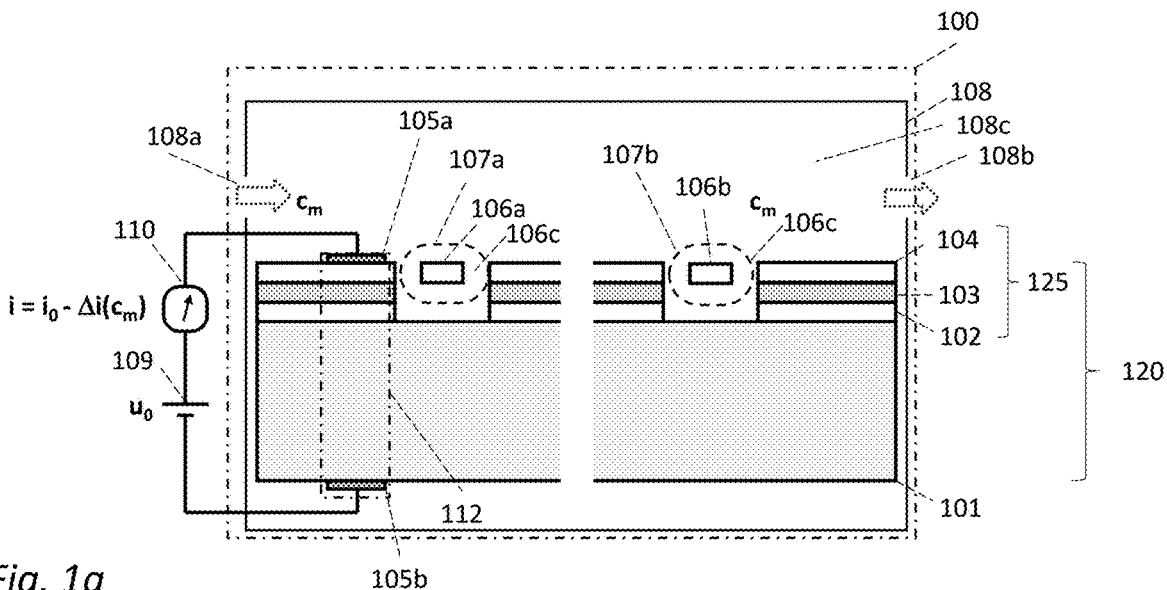
FIGS. 1a-h schematically illustrate the semiconductor gas sensor device according to the invention wherein a) is a cross sectional view, b) is a top view, c) is a cross sectional view of one embodiment, d) is an elevated view of one embodiment and e) is a top view of one embodiment of the invention, f) is a top view of one embodiment of the invention utilizing a line-formed optical waveguide, g) is a graph illustrating a structure of a reflector according to one embodiment of the invention and h) is a graph of the reflectance characteristics of a reflector according to one embodiment of the invention.

All the figures are schematic, not necessarily to scale, and generally only show parts which are necessary in order to elucidate the respective embodiments, whereas other parts may be omitted or merely suggested. Any reference number appearing in multiple drawings refers to the same object or feature throughout the drawings, unless otherwise indicated.

DETAILED DESCRIPTION

Terms such as "top", "bottom", "upper", "lower", "below", "above" etc are used merely with reference to the geometry of the embodiment of the invention shown in the drawings and/or during normal operation or mounting of the device/devices and are not intended to limit the invention in any manner.

According to one aspect of the invention, a device for determining the presence and concentration of a volatile substance in air is provided. According to the invention at least an electromagnetic radiation source and an optical waveguide, and optionally also a detector are integrated on a compound semiconductor chip. Obvious advantages are small size, low production cost and compatibility with other semiconductor devices. By integrating the critical elements on a single chip, fabrication steps requiring high precision and accuracy are being carried out in a processing sequence known as surface micromachining, in which thousands of sensor devices on a single wafer may be processed in parallel. The required manufacturing precision is managed using batch processing of semiconductor wafers, exposing the wafer surfaces to deposition or etching through precisely controlled two-dimensional patterns based on lithography with almost atomic resolution.

According to embodiments of the invention, a single mode laser is integrated with an optical waveguide and means for optical modulation and detection are provided on a compound semiconductor substrate. A well-known fact is that many volatile substances exhibit sharp absorbance peaks in the mid infrared (IR) wavelength range. Furthermore, several group IV and III-V compound semiconductors, exhibit intrinsic properties allowing the design of sources and detectors of electromagnetic radiation within the IR range in a range of emission wavelengths between 0.5 and 10 µm. By alloying IV (e. g. C, Si, Ge) or III-V compounds (e. g., Al, Ga, In, P, As, Sb) using epitaxial crystal growth, complex structures with precisely controlled functionality may be realized. These properties of the group IV and III-V compound semiconductors, and the well-established technologies of producing components out of these materials, makes them good candidates for being the building materials for the semiconductor gas sensor device for determining the presence and concentration of a volatile substance in air according to the present invention.

Three examples of volatile substances, water, carbon dioxide and ethyl alcohol (EtOH), are provided in Table 1 with numbers on peak wavelength $\lambda$ [µm] absorbance $\varepsilon$ [$ppm^{-1}$ $m^{-1}$], and quality factor Q [dimensionless], and dynamic concentration range [min . . . max ppm].

Infrared absorption of volatile substances is based on molecular vibratory transitions according to quantum mechanical transition rules. In the $H_2O$ and $CO_2$ cases, the peaks in Table 1 were selected based on magnitude and sharpness (quality factor, Q). The EtOH peak represents non-rotational transitions corresponding to vibratory stretching of the C—H bond, resulting in a peak surrounded by a continuous background of a mixture between vibratory and rotational transitions. Basically, the same feature of singular sharp absorption peaks is found in most organic compounds with C—H bonds.

TABLE 1

Major absorption peaks for $H_2O$, $CO_2$ and EtOH.

| | $H_2O$ | $CO_2$ | EtOH |
|---|---|---|---|
| Wavelength □ [µm] | 2.671 | 4.235 | 3.345 |
| Absorbance □ [$ppm^{-1}$ $m^{-1}$] | $7.8 \times 10^{-4}$ | $1.58 \times 10^{-2}$ | $2.9 \times 10^{-4}$ |
| Quality factor Q | 16 000 | 25 000 | 1500 |
| Dynamic concentration range [min . . . max ppm] | 1 . . . 50 000 | 1 . . . 100 000 | 0.2 . . . 1000 |

Source: Pacific Northwest National Laboratory, PNNL.

From Table 1 it is notable that all three substances exhibit singular absorption peaks within the outlined spectral range. The wavelengths, absorbances and quality factors vary between the substances but make the peaks clearly distinguishable from the background in most environments, including those of automotive applications. The dynamic concentration ranges have been estimated from data corresponding to in-vehicle applications within the temperature range of −40 . . . +85° C., and exhaled concentrations from human beings. The minimum number corresponds to the resolution requirement, and the maximum number is highest expected concentrations.

The semiconductor gas sensor device 100 according to the invention is schematically illustrated in FIGS. 1 a and b and illustrates the basic principle and the main functional elements of the detecting device according to the invention. FIG. 1a is a cross-sectional view through the compound semiconductor 120 that provides the optically and electrically active parts of the device and FIG. 1b is a top view. The semiconductor gas sensor device 100 comprises a single crystalline substrate 101, typically and preferably a III-V semiconductor, and a multilayer structure 125 provided on top of the single crystalline substrate 101. The multilayer structure 125 may be grown by epitaxy, and also partly removed by lithographic selective etching at certain positions. The layers include but are not limited by a bottom layer 102 acting as a buffer, for example, to harmonize differences in crystalline properties between the substrate 101 and subsequent layers, an optical emission layer 103, and an optical propagation layer 104. In predefined positions, conductive electrodes 105a, b, are supplying the optical emission layer 103 with electric current to induce inverse population of charge carriers, and as a consequence, stimulated coherent emission of IR radiation by laser action. The area between the electrodes 105a, b is defining a laser structure 112. An optical waveguide resonator 106 is provided in which the optical propagation layer 104 is present. The optical waveguide resonator 106 is provided as a largely freely suspended structure a distance above the substrate 101. The optical waveguide resonator 106 may for example be suspended by narrow bridging portions in the optical propagation layer 104, by vertical pillars supporting the optical waveguide resonator 106 from underneath or by other supporting structures that are dimensioned to interfere with the optical properties of the optical waveguide resonator 106 as little as possible. Thereby, an essentially empty space 106c surrounds the optical waveguide resonator 106. The structure of optical waveguide resonator 106 is illustrated in FIG. 1a as the optical waveguide resonator 106 having a left part 106a and a right part 106b. The cross-section of FIG. 1a is through the laser structure 112.

One portion of the optical waveguide resonator 106 is arranged to be adjacent and in close proximity to the laser structure 112. Preferably the distance between the optical waveguide resonator 106 and the laser structure 112 is less than or equal to the wavelength, more preferably less than half the wavelength and even more less than ¼ of the wavelength, wherein "wavelength" refers to the shortest wavelength in the wavelength band in which the semiconductor gas sensor device is intended to be used. Typically, this corresponds to a distance that is 1 μm or less. Thereby, the laser structure 112 will be optical coupled with the optical waveguide resonator 106 and the radiation originating from the emission layer 103 within the laser structure 112 is transmitted into the optical waveguide resonator 106. The optical waveguide resonator 106, is allowing an optical wave to be propagating in the waveguide direction through several turns with low loss. The optical field is only partly confined to the solid waveguide material 106 but is also extending across its physical boundaries into the immediate air environment in the empty space 106c as an evanescent optical field 107a, b, the imaged areas of which should not be regarded as quantitative but as indicative of existence and approximate extension. The evanescent optical field 107a, b also extends to parts of the optical propagation layer 104 which is not part of the optical waveguide resonator 106 and may also extend to the optical emission layer 103 being part of the laser structure 112. The optical waveguide resonator 106 constitutes an optical resonator with a high quality factor optically coupled to the laser structure 112, the emission wavelength band of which is determined by the resonance frequency and quality factor of the waveguide resonator.

According to one embodiment of the invention, the laser structure 112 comprises a waveguide provided on top of the optical emission layer 103. The waveguide of the laser structure may at least partly be provided by the optical propagation layer 104. The optical coupling between the waveguide resonator 106 and the laser structure 112 also comprising a waveguide is provided by their parallel extension in the direction perpendicular to the drawing FIG. 1a). The evanescent fields 107a between the emission layer 103 of the laser structure 112 and the optical propagation layer 104 of the waveguide resonator 106 are overlapping, thereby providing efficient optical coupling.

Figure 1B:
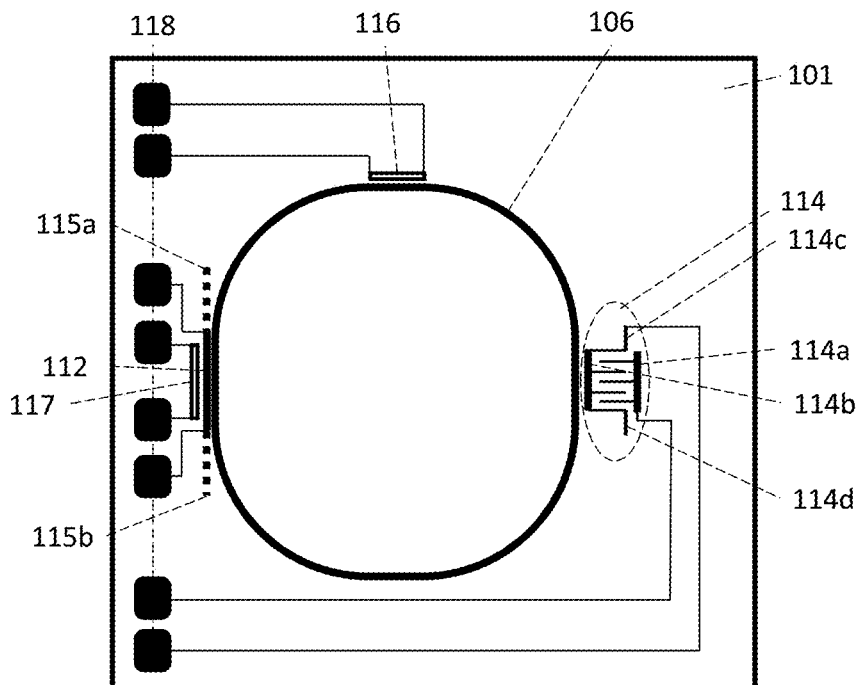
Figure 1C:
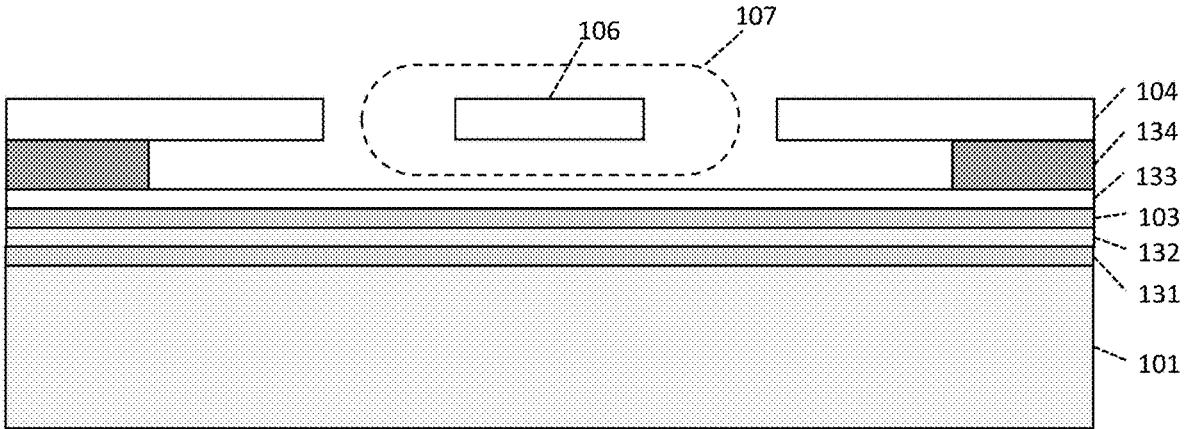
Figure 1D:
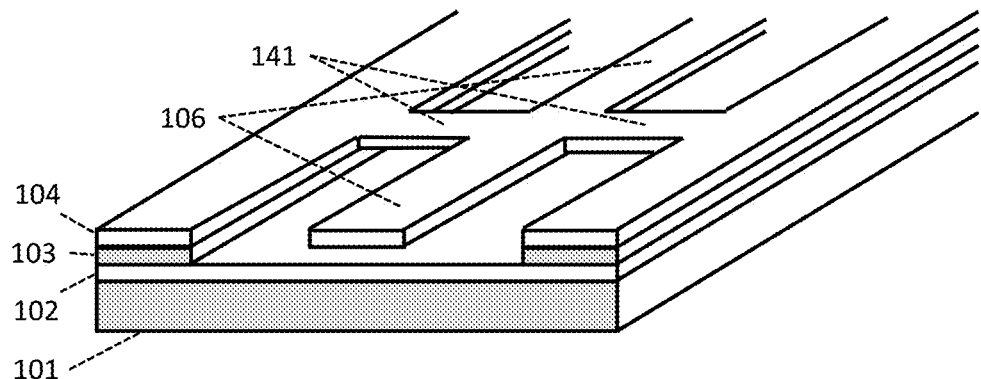

According to embodiments of the invention, schematically illustrated in FIGS. 1a, 1b, and e, the waveguide resonator 106 is a closed-loop structure and should preferably be designed so that its circumference will precisely equal a whole number or integer times the desired resonance wavelength corresponding to the absorption peak of the substance to be detected. The resonance is optically coupled to the laser structure 112, governing its emission peak wavelength $\lambda_r$. Specifically the circumference $C_r = N \times \lambda_r / n_{eff}$, the effective refractive index $n_{eff} = 1.7$ being inserted to account for the fact that the optical propagation is taking place both in the bulk waveguide 106 and as an evanescent field in air, and N being the integer. As previously described, the resonance is optically coupled to the laser structure 112, governing its emission peak wavelength.

Optical radiation is coupled from the laser structure 112 to the optical waveguide resonator 106 due to their alongside close vicinity, and the evanescent field as described in relation to FIG. 1a). The physical distance between the laser structure 112 and the optical waveguide resonator 106 is typically 1 μm, significantly smaller than the IR wavelength. Therefore, optical power, or intensity, will be coupled from the laser structure 112 to the optical waveguide resonator 106, and vice versa. The optical waveguide resonator 106 is suspended to the substrate 101 on a few points along its circumference, but its main part is typically free-hanging, allowing single-mode propagation of IR radiation along its circumference with low optical loss.

The optical propagation layer 104 and hence the optical waveguide resonator 106 is formed by a single crystalline III-V semiconductor material epitaxially grown on the substrate 101, with a composition to make it highly transparent to the IR radiation generated by the laser structure 112. A sacrificial layer has been etched away beneath the optical propagation layer 104 of the optical waveguide resonator 106 to form the empty space 106c. The optical waveguide resonator 106 may typically have a rectangular cross section with width/thickness of approximately 2.0/0.2 μm or preferably 2.0±0.5/0.2±0.1 μm. The gap defined by the sacrificial layer may typically be in the order of 2 μm or preferably 2.0±0.5 μm. Typically, during use, the IR radiation propagates twenty turns or more along the circumference before being completely scattered or absorbed.

The semiconductor gas sensor device 100 may further comprise a housing 108 providing a measurement chamber 108c accommodating the compound semiconductor 120. The housing 108 is provided with an air inlet 108a and an air outlet 108b leading in and out to the measurement chamber 108c, respectively.

Without being bound by theory it may be estimated that approximately half the radiation power associated with the propagating electromagnetic wave is propagated within the optical waveguide resonator 106, the other half constituting an evanescent wave propagated in the air, in close vicinity to the solid-state waveguide. This dimensionless proportion will be denoted external confinement factor $\Gamma$ in the following, depending on the magnitude of the empty space 106c among other factors. A comprehensive description of technical details of waveguide implementations is given in F. Ottonello Briano, *Mid-Infrared Photonic Devices for On-Chip Optical Gas Sensing*, Doctoral Thesis, The Royal Institute of Technology, Stockholm, Sweden, 2019.

According to one embodiment, the optical waveguide resonator 106 has an almost circular geometry, and constitutes a high-Q optical resonator, with a quality factor Q exceeding $10^4$. This is achieved by minimizing optical loss due to waveguide bending and scattering due to surface imperfection. Its circumference is typically 1.2 mm.

According to one embodiment, the optical waveguide resonator 106 comprises both curved and linear sectors as outlined in FIG. 1b). Thereby efficient optical coupling to the laser structure 112, and to a modulator 114, if such is utilized, can be achieved, while maintaining low optical bending loss in the curved sectors.

Figure 1E:
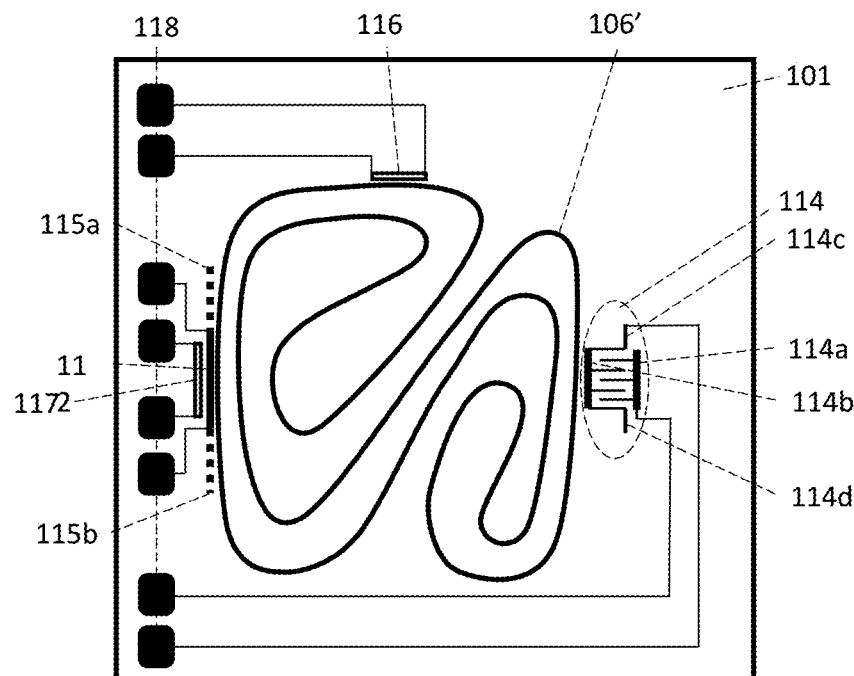

The optical waveguide resonator 106 has with reference to FIGS. 1a-1b been described as generally ringed-formed. More elaborate geometries could in certain cases be advantageous and FIG. 1e illustrates an embodiment of the present invention in which the waveguide resonator 106' is closed-looped in the sense that optical propagation is possible through several turns of the structure, by one end meeting the other. Instead of a ring shape as in FIG. 1 b) the waveguide in FIG. 1 e) has an S-shape, allowing the optical path of a single turn to be larger than a ring structure occupying similar area. On the other hand, the S-shape inevitably means smaller radius of curvature resulting in higher bending loss. As in the embodiment illustrated in FIG. 1 b), the optical coupling between the waveguide structure 106' and the laser waveguide 113 is enabled by them running in parallel and in close vicinity.

During use, air flowing close to the sensor substrate 101 between the inlet and outlet 108 a,b, will interact with the optical waveguide resonator 106 and optionally also with the laser-waveguide of the laser structure 112 and if the air-flow it includes a volatile substance with a concentration $c_m$, and the volatile substance has an absorption peak coinciding with the emission wavelength of the laser structure 112. The interaction from the volatile substance will cause an optical power dissipation of the electromagnetic propagating in the optical waveguide resonator 106 and may according to the invention be detected with the laser structure 112 itself or with additional detecting means, representing different embodiments of the invention.

According to one embodiment, the semiconductor gas sensor device 100 is arranged to utilize the current-voltage characteristic of the laser structure 112 as the means to detect the interaction with the volatile substance, i.e., the optical power dissipation in the optical waveguide resonator 106. The power absorption of the laser structure 112 will influence the current-voltage characteristic of the laser as an additional power load according to the schematic equation $$i = i_0 - \Delta i(C_m) \qquad (1)$$

where $i_0$ is the current at a supply voltage $u_0$, unaffected by absorption from the volatile substance, and $\Delta i(c_m)$ is the current variation due to additional power load which is a monotonous function of the substance concentration $c_m$. A source 109 of constant voltage $u_0$, and a current meter 110 for measuring the current i, connected to the laser electrodes 105a, b, are schematically illustrated in FIG. 1a.

The sensor chip shown in a top view in FIG. 1b may have typical surface dimensions of 0.5×0.5 mm², and thickness 0.3 mm. In addition to elements described in relation to FIG. 1a, other elements are included in FIG. 1 b) which may add to the performance and applicability of the sensor according to the invention and represents different embodiments of the invention.

According to embodiments of the invention the compound semiconductor 120 comprises, in addition to the laser structure 112 and the optical waveguide resonator 106 one or a combination of the following elements: a MEMS modulator 114a, 114b, optical feedback gratings 115a, 115b together with a laser optical waveguide 113, one or more photodetectors, typically a photodiode 116 and one or more temperature sensors 117. By close temperature control, the position of the specific wavelength band can be adjusted to a portion close to the absorption peak of the substance, thereby defining a wavelength range for modulation. This may be used in a setup and calibration procedure to ensure proper functioning of each individual sensor 100 according to the invention.

All elements 112, 106, 113, 114a, 114b, 115a, 115b, 116, 117 are formed by a combination of epitaxial growth and other additive deposition or subtractive steps, such as etching. The photodetector may also be realized as a photoresistor, a phototransistor or as a combination and/or an array of such detectors. Contact pads or terminals 118 are provided for electrical communication between the elements and external electronic circuitry. The terminals 118 are preferably arranged in a single row to facilitate connection to other components by, for example, wire bonding.

The laser structure 112 is arranged to emit single-mode infrared radiation along the surface of the substrate 101 in the plane of the device. According to one embodiment the laser structure 112 are combined with optical feedback gratings 115a, 115b. The optical feedback gratings 115a, 115b include repetitive patterns with consecutive variable index of refraction resulting in constructive reflectance at distinct optical wavelengths defined by a repetition pattern of consecutive layers grown on, or etched from, the substrate 101. It represents an optical resonator designed for a quality factor of approximately 300.

The feedback lines 115a, 115b and the waveguide 113, provided in an embodiment of the invention are preferably formed in the optical propagation layer 104, constitute optical resonating elements controlling the emission from the laser. The single mode emission of the laser 112 is thus controlled by the exact dimensioning of its critical parameters, such as length, width and thickness of the waveguide, index of refraction, and the length, depth, width, and repetition rate of consecutive steps of the feedback lines 115a, 115b.

According to one embodiment, a MEMS (micro electro-mechanical structure) modulator 114 is provided and, like the optical waveguide resonator 106, built from partly suspended, partly freely hanging, thin elements formed at least partly in the optical propagation layer 104. The MEMS modulator comprises a stationary element 114a and flexible lines 114b, 114c and 114d. By applying voltage between the interdigitated "fingers" of elements 114a and 114b, bending will be induced in the elements 114c and 114 d, which in turn will result in slight horizontal movements of the line 114b. By its close vicinity to the optical waveguide resonator 106, the optical resonance frequency of the optical waveguide resonator 106 may be modulated in a controlled manner.

Preferably, the modulator 114 is operating at its mechanical resonance frequency within the range $10^3$-$10^4$ Hz, determined by the mass of the moveable line 114b parallel to the waveguide 103, and the effective spring constant of the flexible members 114c and 114d. Technical details may be found in C. Errando-Herranz et al, IEEE Journal of Selected Topics in Quantum Electronics vol. 26, (2020), and P. Edinger et al, Conference on Lasers and Electro-Optics (2020), paper SM3J.2.

According to one embodiment, a photodiode 116 is provided in close vicinity to the optical waveguide resonator 106 at another position along its circumference. The distance between the photodiode 116 and the optical waveguide resonator 106 may preferably be 3-10 μm and selected so that the Q-value of optical waveguide resonator 106 is not adversely affected. The photodiode 116 is basically a pn-junction with a composition and energy band gap adapted to absorb incident IR radiation. The photocurrent generated in the pn junction is representative of the total optical power propagated by the waveguide. The small portion $10^{-5}$ or less absorbed by the photodiode 116 is adapted not to influence the quality factor of the optical waveguide resonator 106 to a large extent.

According to one embodiment one or several temperature sensors 117 is provided in the compound semiconductor 120. According to one embodiment, a temperature sensor 117 is positioned close to the laser structure 112 with the purpose of monitoring the operating laser temperature. The temperature sensor 117 is preferably a pn-junction of III-V material composition with an energy bandgap higher than the energy of the propagated IR radiation. The open circuit voltage of the pn-junction is a reliable measure of temperature being mostly dependent on its bandgap which in turn is reproducible dependent on temperature. Further temperature sensors 117 may be positioned to measure the temperature of the gas in the measurement chamber 108c.

During operation, the compound semiconductor 120 should preferably be kept within a controlled temperature interval, typically 40±1° C. According to one embodiment, this is accomplished by mounting the compound semiconductor 120 with its associated elements on top of a Peltier element (not shown). By this arrangement, the sensor according to the invention may accommodate an external operating temperature range of −40 to +85° C., or more.

As appreciated by the person skilled in the art, the above described structure may comprise additional layers and for example the optical emission layer 103 and the optical propagation layer 104 may comprise sublayers. An illustrative but non-limiting example is schematically illustrated in a cross-sectional view in FIG. 1 c). According to the embodiment, several single crystalline III-V semiconductor layers 131, 132, 103, 133, 134, 104 are deposited on the substrate 101 by molecular beam epitaxy, allowing close control of composition, crystal quality and thickness. Removal of one or several layers on specific areas may be accomplished by etching, controlled by a mask temporarily deposited to cover areas to be protected from etching. The layers 131, 132, surrounding the optical emission layer 103 are used for defining the laser structure 112 (not shown). The layer 133, preferably with the same composition as the active waveguide layer 104, acts as a stop layer when the sacrificial layer 134 is being etched off, allowing the optical waveguide resonator 106 to be freely hanging at the cross-section position, thereby allowing space for an evanescent optical field 107 in its near vicinity.

Etching techniques for generating steep vertical walls are known as anisotropic chemical etching or reactive ion beam etching (RIE). Sacrificial layers may preferably be etched off using composition-based selectivity, photo-electrochemical etching, or doping-selective etching (DSE), commonly using the same composition as stop layer and free-hanging structure. For more technical details, see B Hök, C Ovrén, E Gustafsson *Batch Fabrication of Micromechanical Ele-ments in GaAs—AlGaAs*, Sensors and Actuators 4, 1983, 341-348, L Tenerz, B Hök *Micromachining of Three-Dimensional Structures Using Photo-Electrochemical Etching*, Electronics Letters, 21, 1985, 1207-1208, and Y Lindén, L Tenerz, J Tirén, B Hök *Fabrication of Three-Dimensional Silicon Structures By Means of Doping-Selective Etching (DSE)*, Sensors and Actuators 16, 1989, 67-82.

FIG. 1 d) illustrates a portion of the optical waveguide resonator 106 where it is being mechanically attached to the substrate 101. As in FIG. 1 a), the optical waveguide resonator 106 is built up by deposition of several layers 102, 103, 104 on a semiconductor substrate 101. The layer 103 is partly sacrificed controlled by lithography and selective etching as previously described. The optical waveguide resonator 106 consists of parts of the layer 104 that are left freely hanging at almost its entire circumference except for positions where it is supported by bridges 141 crossing the optical waveguide resonator 106 and attached to the substrate 101 through remaining parts of layer 103, and 102. The width of the bridges 141 is typically 1 μm for minimum interference with the optical propagation through the optical waveguide resonator 106.

FIG. 1e) schematically illustrates the same elements as FIG. 1b) but with an alternative design, representing one embodiment, of the optical waveguide resonator 106' which compared to a circle, includes several turns before connecting one end to the other. However, it still has the closed looped structure, and its total length will be significantly longer than the circumference of a circle occupying the same surface. Optical path length is a key parameter for the sensitivity of the sensor according to the invention but is counteracted by loss of optical power due to bending of the waveguide. The choice between the optical waveguide resonator having a circular waveguide 106 or its more dense alternative 106' is thus a question related to technical performance requirements in various applications.

Figure 1F:
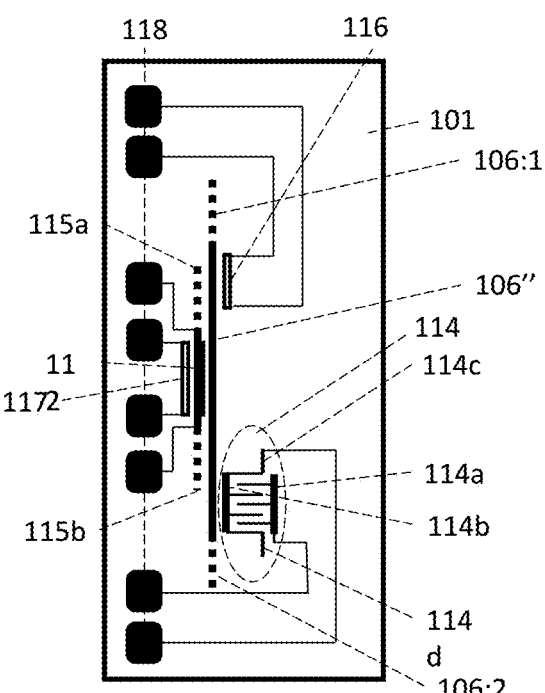
Figure 1G:
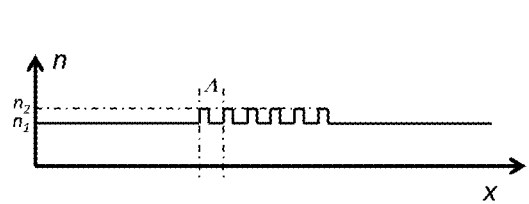
Figure 1H:
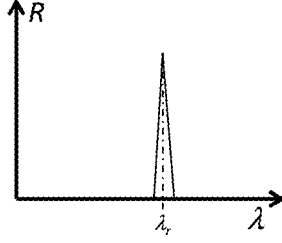

FIG. 1f illustrates schematically one embodiment of the gas sensing device 100 comprising an open optical waveguide resonator 106". Open should here be interpreted as not being in a closed loop arrangement and the optical waveguide resonator 106" according to this embodiment may be described as line-formed, for example but not limited to a straight line. The open optical waveguide resonator 106" is similar to the arrangement described above with the closed loop optical waveguide resonator 106, arranged adjacent to the laser structure 112 and may also be arranged to interact with a MEMS modulator 114 and/or with a photodiode 116. The open optical waveguide resonator 106" may preferably be provided with at least one mirror or reflector. According to one embodiment a first reflector 106:1 and a second reflector 106:2, provided at each end of the open optical waveguide resonator 106". The first and second reflectors 106:1, 106:2 provides for increasing the optical path of the open optical waveguide resonator 106". The first and second reflectors 106:1 and 106:2 may be provided as periodic perturbation, for example as a periodic variations of refractive index or as a grating. FIG. 1 g-h) are graphs illustrating the function of a wavelength specific mirror operating along the length x of a waveguide. By introducing a periodic perturbation with respect to variation $n_1$, $n_2$ of the refractive index n of a waveguide, maximum optical reflectance R will occur at a certain wavelength $\lambda_r$ given by the relation $\lambda_r = 2n_e\Lambda$, where is the periodicity of the refractive index variation, and $n_e$ is the effective refractive index, typically a weighted average between $n_1$, $n_2$, and the ambient refractive index (close to 1). Periodic variations of refractive index may be introduced by doping the waveguide material through a lithographic mask. The sharpness of the peak reflectance, illustrated in the graph of FIG. 1$h$, may be controlled by the number of perturbations, their precision in spatial resolution, and fine structure. In the present invention, the effect of a wavelength specific mirror may be used either to provide the resonator function as an alternative to the ring waveguide 106 in FIGS. 1 $a$) and 1 $b$), or providing the feedback lines 115$a$, $b$.

Figure 2:
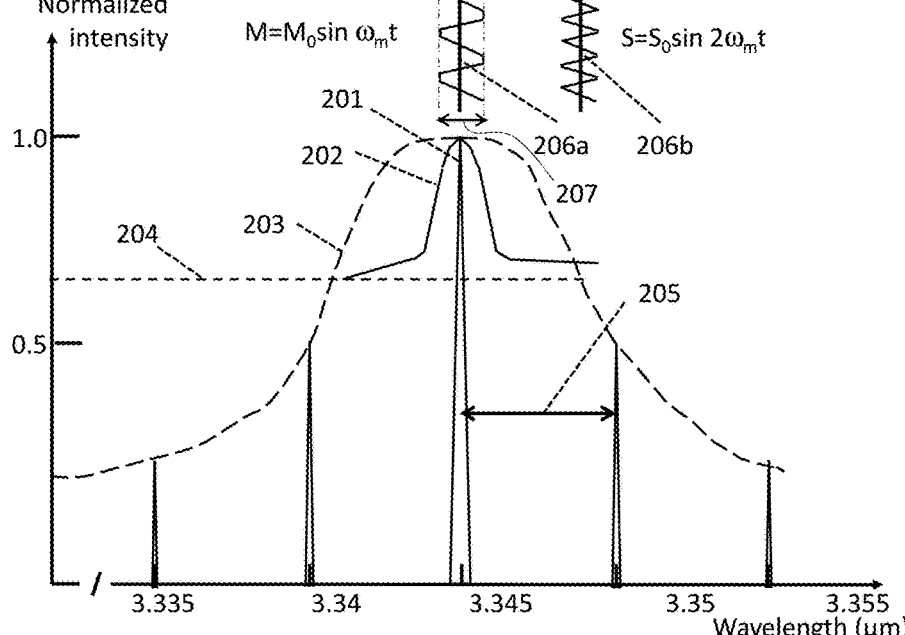
FIG. 2 is a graph illustrating the functionality of the semiconductor gas sensor device according to the invention.

In FIG. 2 the functional operation of the semiconductor gas sensor device 100 according to the invention is outlined by means of a graph with wavelength as the abscissa, normalized optical intensity or power as ordinate. The exemplified embodiment of the invention is an EtOH sensor operating close to the absorption peak 202 at 3.345 μm with a quality factor of approximately 1500. Very similar drawings could be made with other implementations of, for example, $H_2O$ or $CO_2$ sensors at their respective peak wavelengths. The EtOH peak 202 extends above a continuous absorptive "floor", due to molecular rotational transitions which at normal operating temperatures constitute a continuous absorptive background. However, this fact is of subordinate importance here, since the operation of the sensor is focusing on a small wavelength interval, typically ±1 nm (0.001 μm), close to the EtOH peak 202 at 3.345 μm, and controlled by the modulation depth of the modulator 114 or by controllably modulating the voltage feed circuitry 109.

The laser structure 112 combined with the optical waveguide resonator 106 is operating at a sharp peak 201, the quality factor, approximately $10^4$, of which is basically determined by the optical waveguide resonator 106. The specific wavelength band illustrated by the peak 201 is partly overlapping the substance absorption peak 202. Additional resonances of the optical waveguide resonator 106 of FIG. 1 $b$) occur with a spacing 205 of approximately 5 μm corresponding to its free spectral range $FSR=\lambda_r^2/n_eL_0$, in which $\lambda_r$=3.345 μm is the operating wavelength, $n_e$=1.7 the effective refractive index, and $L_0$=1.2 mm is the waveguide circumference.

The peak 203 with Q≈300 originates from the optical feedback gratings 115$a$, 115$b$. They are suppressing the influence of the side peaks to peak 201, so that the threshold 204 for laser operation is only exceeded for the central peak 201, thus maintaining single mode optical emission at the peak 201. Thus, the side peaks shown in FIG. 2 are not emitted from the laser structure 112. By close temperature control, as described above, the position of the specific wavelength band, as shown by the central peak 201, can be adjusted to be close to the absorption peak 202 of EtOH.

As described above, the modulation signal to the modulator 114$a$, 114$b$, or the modulation signal applied to the voltage feed circuitry 109, is controlling the exact location of the waveguide resonance peak within a short wavelength interval or, in other words, the position of the specific wavelength band. In FIG. 2, the wavelength modulation of the specific wavelength band 201 is shown as the interval 207. The graph 206$a$ shows the position of the specific wavelength band 201 as a function of time and the graph 206$b$ shows the resulting signal $S=S_0 \sin 2\omega_m t$. The signal will be described in more detail below. Preferably, the modulation is performed with a sinusoidal angular frequency $\omega_m$ determined by the mechanical resonance frequency of the MEMS resonator 114$a$, 114$b$ as previously described, or correspondingly in the alternative with electronic modulation of the voltage feed circuitry 109. The modulation amplitude $M_0$ is preferably determined by the wavelength range adapted to the quality factor of the substance peak. Twice during each modulation cycle, absorption of optical power will peak when the EtOH substance is present in the vicinity of the optical waveguide resonator 106. A signal representing power consumption synchronous to the modulation, having twice the modulation frequency will thus occur in the presence of the substance. The occurrence and amplitude of a synchronous detection signal at twice the modulation frequency will thus be carrying information of the presence and concentration of the EtOH substance close to the optical waveguide resonator 106.

Single-crystalline III-V semiconductors offer a unique technological platform for the design of complex integrated structures, such as the present invention. Various combinations of elements from group III and V of the periodic table including aluminum (Al), gallium (Ga), indium (In) on the one hand (group III) and phosphorous (P), arsenic (As), and antimony (Sb), on the other (group V). Similar structures can be fabricated using group IV semiconductor compounds by alloying carbon (C), silicon (Si) and germanium (Ge) in various concentrations.

Figure 3A:
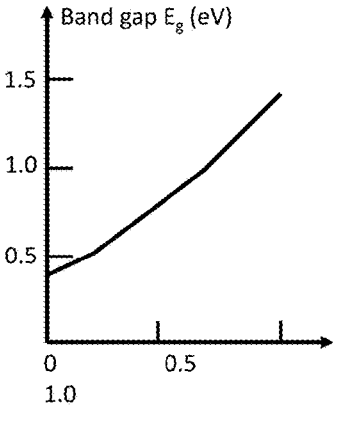
FIGS. 3a-c are graphs illustrating the properties of $In_{1-x}Ga_xAs$.
Figure 3B:
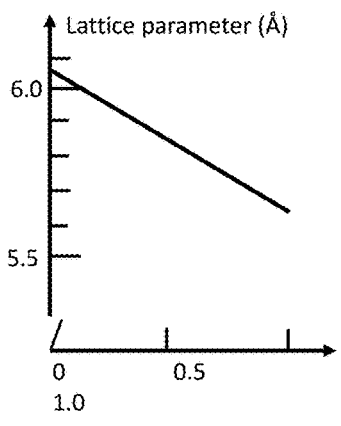
Figure 3C:
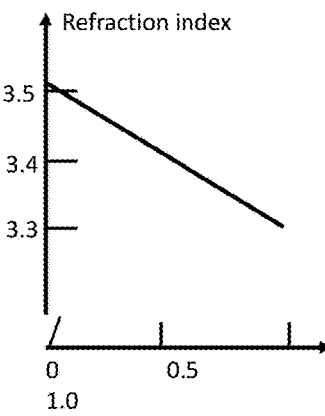

By alloying either group IV, or group III and V elements it is possible to match specific properties, such as energy band gap, crystalline lattice constant, and index of refraction. This is illustrated in FIGS. 3 $a$), $b$) and $c$) for the compound $In_{1-x}Al_xAs$, where x is the mole fraction of aluminum compared to indium (1−x) in the compound. The three properties are continuous and almost linear functions of the mole fraction x, allowing the design of optoelectronic devices with specific and well-controlled properties. By doping the III-V compounds with p- or n-dopants belonging to group II, IV or VI of the periodic table, pn-junctions may be incorporated for various purposes.

Two embodiments of laser structures 112 will be described by way of example in relation to FIG. 4, in which 4 $a$) and 4 $b$) describe the basic function of a double heterostructure (DH) laser, whereas 4 $c$) illustrates a quantum cascade laser. Both cases are exemplifying an EtOH sensor operating a 3.345 μm. It should be noted that other volatile substances, including $H_2O$ and $CO_2$, could have been chosen for equally valid examples. The only differences would have been numerical with respect to parameter values. A semiconductor gas sensor device according to the invention may be designed for any such substance.

Figure 4A:
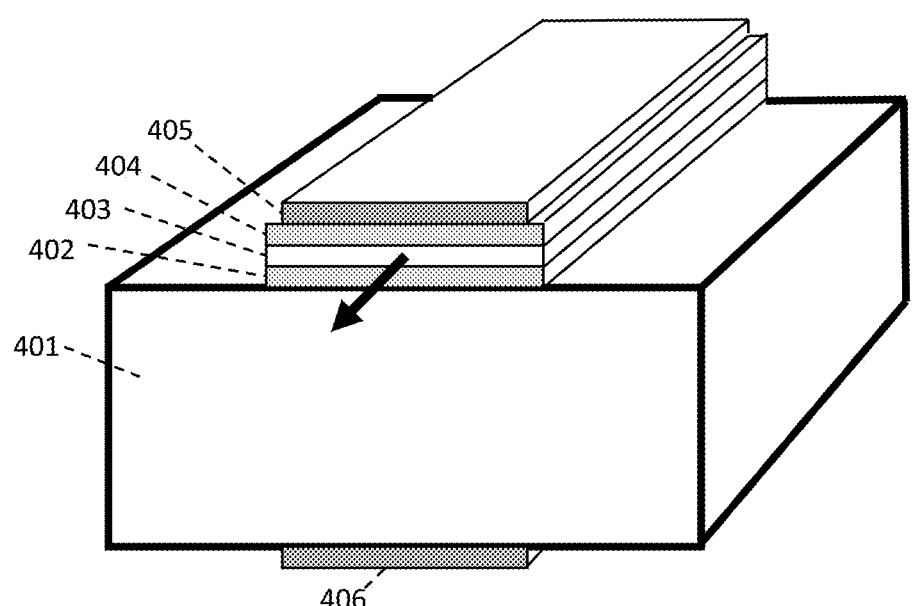
FIGS. 4a-c schematically illustrate an embodiment of the invention comprising a double heterostructure laser structure (a and b) and a quantum cascade laser structure (c), wherein a) is an elevated view of the double heterostructure laser structure laser structure, b) is a laser energy band diagram and c) is quantum cascade energy band diagram.
Figure 4B:
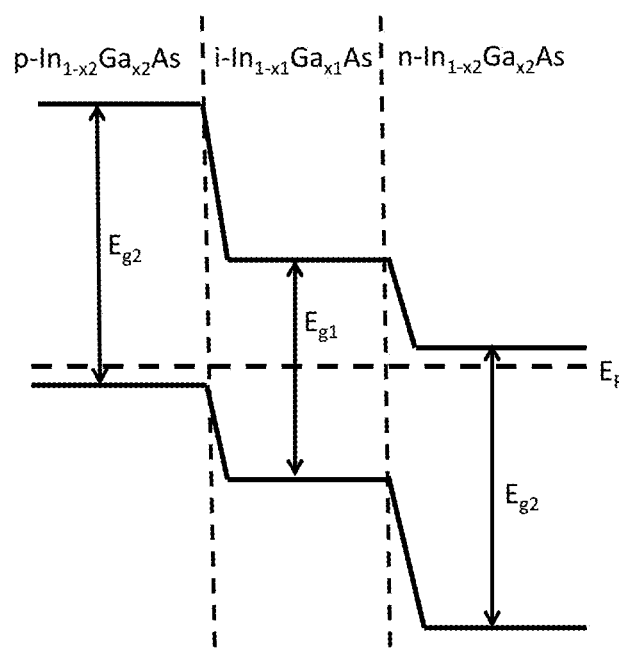

The generic DH laser structure of FIG. 4 $a$) depicts a multilayer structure grown by epitaxy on top of an n-doped indium arsenide (n-InAs) substrate 401. The active layer 403 in which laser emission occurs, has a small concentration of gallium to obtain the nominal energy bandgap 0.371 eV, corresponding to the required emission wavelength of 3.345 μm. As indicated in FIG. 3 $a$), this is obtained with a minor mole fraction x1=0.022, pure InAs having a bandgap of 0.353 eV. The active layer 403 with composition $In_{1-x1}Ga_{x1}As$ is surrounded by layers 402 and 404 transparent to the laser emission, with mole fraction x2=0.1 of gallium.

The active layer 403 is intrinsic, lacking dopants, whereas the layer 402 closest to the substrate 401 is doped with n-doped $In_{1-x2}Ga_{x2}As$, and the top layer is p-doped. A pn-junction is thus prevalent across the active layer 403. On top of the laser structure is a metallic layer 405, preferably gold or other highly conductive metal, constituting the anode connection of the laser structure. A cathode connection 406 may be a metal layer at the bottom of the substrate 401 as depicted in FIG. 4$a$), but may also be arranged from the surface as depicted in FIG. 1$b$).

FIG. 4$b$) shows an energy diagram of the laser structure at equilibrium, i. e. without voltage applied between the anode-cathode connections. The conduction and valence bands are drawn with solid lines across the structure, with the bandgap $E_{g1}$ of the active layer being surrounded by two layers having a higher bandgap $E_{g2}$, due to their higher gallium concentration. The doping of the layers is positioning the energy bands with respect to each other, and to the Fermi energy level $E_F$ in accordance with basic semiconductor theory.

When voltage is applied through the anode-cathode connections in the forward direction, the charge carriers, electrons and holes, are injected across the pn-junction causing them to recombine in the active region while emitting photons having an energy close to $E_{g1}$. At some threshold current, the population of carriers becomes inverted, and the spontaneous and uncorrelated photon emission will be overturned by stimulated, coherent emission according to basic laser theory.

Figure 4C:
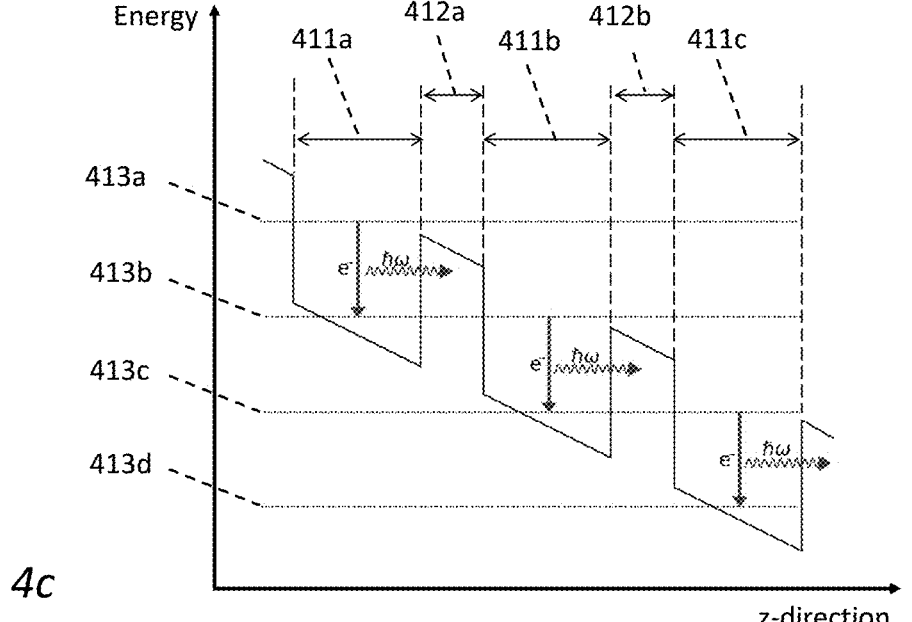

FIG. 4c) shows an energy band diagram of another laser structure, a quantum cascade laser, representing the laser structure 112 according to one embodiment of the invention. For clarity, this diagram only shows a small portion of the optical emission layer. The structure is built up from a super lattice of equidistant, and extremely thin semiconductor layers 411a-d, and 412a-c in the horizontal direction of the diagram. The layers 411a-d constitute quantum wells, whereas layers 412a-c are energy barriers due to the differences in composition. The super lattice may include hundreds of layers of which only a few are depicted in FIG. 4c). The thickness of each layer is typically a few nanometers, which is comparable to the de Broglie wavelength of electrons. Thereby the electrons are confined to occupy discrete energy levels 413a-d in the band diagram depicted as dashed lines.

When electrons e are injected into the structure from the left of FIG. 4c), some of them will tunnel across the thin potential barriers 412a-c, and occasionally, photons will be emitted with energy $E=\hbar\omega$ corresponding to the difference between the discrete energy levels 413a-d. In the expression of E, $\hbar=h/2\pi$, $h=6.63\times10^{-34}$ Js, Planck's constant, and $\omega$ is the angular frequency of the emitted IR radiation. A cascade of coherent photons will eventually be built up by laser action driven by population inversion due to injection of highly energetic electrons combined with non-radiative scattering from the lowest energy levels.

Figure 5:
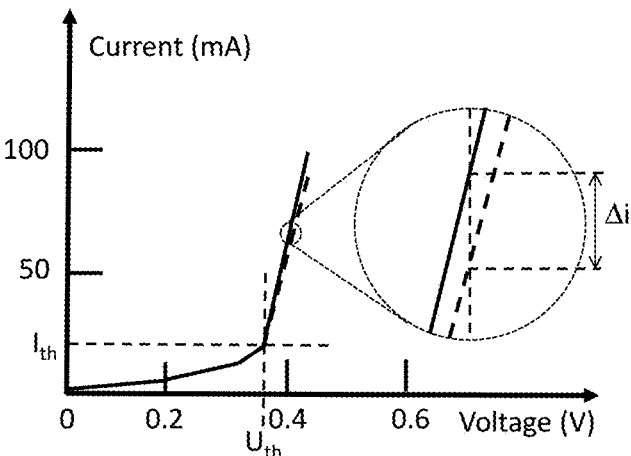
FIG. 5 is a graph illustrating the current/voltage characteristics of a laser structure.

FIG. 5 shows a typical current-voltage characteristics of a laser structure according to the invention. The basic signal characteristics is similar in both DH structure lasers and quantum cascade lasers. The current magnitude is small before reaching a threshold corresponding to the transition from spontaneous to stimulated emission as discussed before. The threshold voltage $u_{th}$ is related to the emitted wavelength $\lambda_0$ by the relation $u_{th}=hc/e\lambda_0$, where $h=6.6\times10^{-34}$ Js is Planck's constant, $c=3\times10^8$ m/s is the light velocity, and $e=1.6\times10^{-19}$ As is the electron charge. When the voltage $u_{th}=0.371$ V threshold is exceeded for the EtOH case with $\lambda_0=3.345$ μm, the current will increase with a linear slope with respect to voltage. The slope, or differential conductance will depend on the power dissipation across the various system elements. In the absence of a volatile substance, the loss within the optical waveguide is relying on its quality factor, $Q_{wg}=10^4$. This situation corresponds to the solid line the graph of FIG. 5. In the presence of substance, corresponding to the dashed line in FIG. 5, the slope of the current-voltage characteristics will decrease due to the absorption loss. When the laser wavelength is modulated across the substance absorption peak by means of a MEMS modulator 114, current measurement at a constant voltage will give rise to a signal having twice the modulation frequency as schematically depicted in FIG. 2. Its amplitude will be proportional to the substance concentration. A similar situation occurs when, as an alternative or complement to the MEMS modulator 114, modulation is performed by periodic variations of the operating voltage from the voltage source 109 at a constant angular modulation frequency $\omega_m$. The modulated voltage will give rise to a small modulation of the temperature of the active layer and a corresponding, synchronous wavelength shift of the specific wavelength band generated within the active laser structure 112. Typically, the modulation frequency $f_m=\omega_m/2\pi$ is within the range 10 . . . 1 000 Hz, depending on signal bandwidth requirements.

Two different options, the MEMS modulator 114 and modulation of the voltage source 109, may thus be utilized to obtain the necessary wavelength modulation as defined in this invention, the sideways movement of the specific wavelength band across the absorption substance peak as depicted in FIG. 2, and the synchronous detection of the power loss amplitude at twice the modulation frequency.

Figure 6:
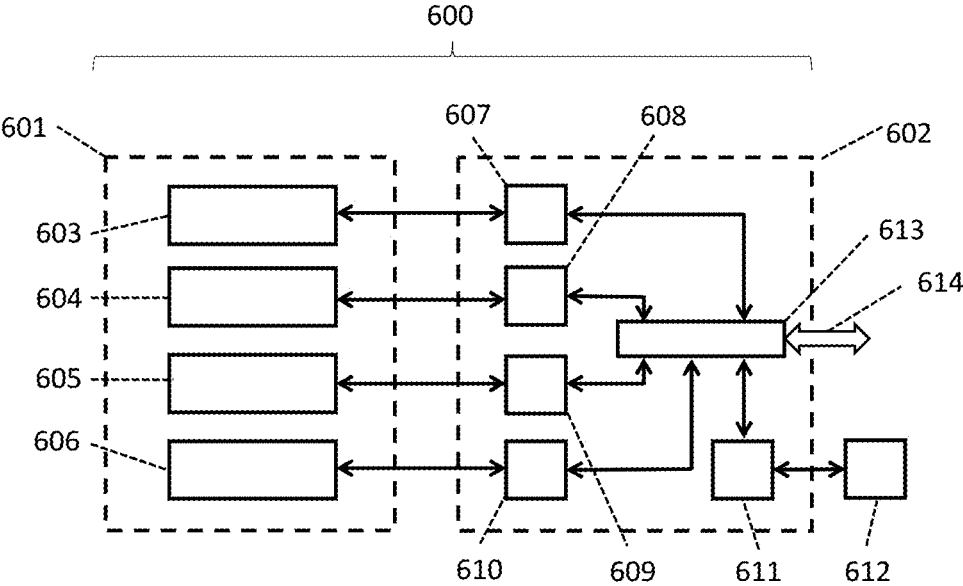
FIG. 6 schematically illustrate a sensor system configuration according to the invention.

FIG. 6 schematically illustrates an exemplifying embodiment of a sensor system 600 according to the invention. The semiconductor gas sensor device 601, which also may be referred to as an on-chip sensor unit, is connected to an electronic unit 602 via its terminals or contact pads as already illustrated in FIG. 1a) as item 105 a, b, and in FIG. 1b) as item 118. The four sensor elements laser structure 603, optical modulator 604, photodiode 605, and temperature sensor 606 are connected to electronic buffer circuit elements 607, 608, 609, 610, providing analog/digital conversion, or vice versa, and other interface functions. An electronic control unit 613, typically a programmable general-purpose arithmetic and logical processor including memory cells for permanent and temporary data storage, is used for controlling the operation of the sensor unit 601 and its wired or wireless communication 614 with external circuitry. As apparent, an on-chip sensor unit 601 comprising less elements would have less contact means and correspondingly less buffer circuit elements.

In one embodiment of the sensor system according to the invention, electronic modulation is performed by the electronic unit 602, instead of the optical modulator 604, corresponding to 114a-d of FIG. 1b). In this embodiment, a modulating voltage, for example a sinusoidally varying modulation voltage $M=M_0 \sin \omega_m t$ is superimposed on a DC drive voltage and applied to the laser structure terminals 105a,b of FIG. 1a). In the presence of the substance to be detected, the current to terminals 105a,b, represents a signal with the double modulation frequency $S=S_0 \sin 2\omega_m t$ will be detected, and its amplitude $S_0$ will be a linear function of the substance concentration $c_m$, as has already been described in relation to FIG. 5 In this embodiment, the electronic control unit 613 mediated by the buffer unit 607 in FIG. 6 connected to the laser structure 606, is providing the required modulation and demodulation operations.

The interface circuitry 611 may also comprise means for controlling the temperature for example by means of a Peltier element 612, also administered by the processor 613. Preferably, the heating and cooling capacity of the Peltier element 612 is controlled by more than one temperature, including at least one point remotely positioned from sources of local heat dissipation. The Peltier element 612 preferably has a significantly larger thermal capacity than the sensor substrate 101.

The electronic unit 602 preferably comprises a single crystalline silicon chip with integrated circuitry, a dedicated application specific integrated circuit, ASIC, designed specifically for the purpose of determining the concentration of a volatile substance. Several such devices may be combined for the measurement or monitoring of a multitude of substances.

The gas sensor system 600 according to the present invention may for example be utilized in breath alcohol devices, handheld devices for mobile use, stationary or mobile environmental monitoring devices, instruments for medical diagnostics and patient monitoring, vehicle monitoring devices and systems, industrial processing equipment, and household appliances.

In particular the gas sensor system may be particularly useful in implementations where small physical size, robustness, low production cost, and low power consumption is important.

Figure 7:
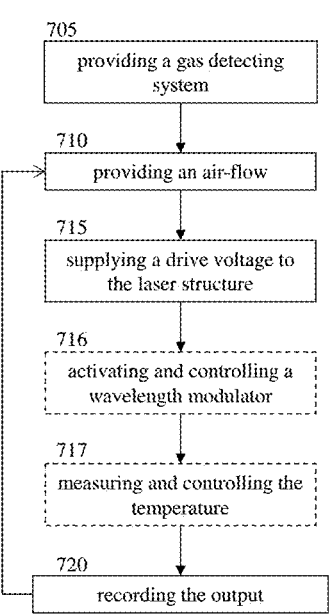
FIG. 7 is a flowchart illustrating the method according to the invention.

A method of determining the concentration of a volatile substance within an air flow utilizing a gas detecting system 600 comprising a gas sensor device 601 as described above will be described with reference to the flowchart of FIG. 7. The method of determining the concentration of a volatile substance within an airflow utilizing the gas detecting system described above comprises the steps:

705: providing a gas detecting system 600;

710: providing an airflow to the immediate surroundings of the semiconductor gas sensor device 100 of the gas detecting system 600;

715: supplying a drive voltage to the laser structure 112 of the semiconductor gas sensor device 100; and

720: recording the output from the means for detecting 112; 116 relating to the optical power dissipation of an electromagnetic wave propagating in the optical waveguide resonator 106 being affected by volatile substance within an air flow.

The steps of providing an airflow 710, supplying a drive voltage 715 and recording the output are repeated for each determination of a volatile substance in an airflow. One determination may also comprise recording a plurality of measurements and using for example a statistical mean of a measure of the concentration.

According to one embodiment the laser structure is utilized not only to generate the electromagnetic radiation, but also to detect the optical power dissipation caused by the interaction with the volatile substance, by monitoring and controlling the current and voltage of the laser structure 112 and basing the determination of the concentration of a volatile substance on how the current-voltage characteristic of the laser structure 112 is influenced by the volatile substance within the air-flow.

Alternatively, the method comprises monitoring and analyzing the output from an optical detector, for example a photodiode 116 detecting the optical power dissipation in the optical waveguide resonator 106. The optical detector may require a drive voltage/current, which would be supplied with appropriate known means.

The method may further comprise a step 716 of activating and controlling a wavelength modulator 604 operating either by means of a MEMS modulator 114 or by modulating the voltage source 109 and thereby controlling and fine tuning the optical resonance frequency of the optical waveguide resonator 106.

The method may further comprise a step 717 of measuring and controlling the temperature of the gas sensor device 601 for example comprising controlling the current supplied to a Peltier element 612 in thermal connection with the gas sensor device 601. The method may further comprise measuring the temperature in the airflow.

EXAMPLE

In the example below, EtOH is used as exemplifying substance to be detected. Corresponding calculations can be performed on other substances, such as $H_2O$ and $CO_2$, using other numerical parameters. In the following, calculations are provided to describe basic performance limitations with respect to signal resolution which represents fundamental limitations of applicability. Parameter values are based on data from commercial products (Nanoplus GmbH, Germany) and published experimental data (F. Ottonello Briano, *Mid-Infrared Photonic Devices for On-Chip Optical Gas Sensing*, Doctoral Thesis, The Royal Institute of Technology, Stockholm, Sweden, 2019). The data are concerned with devices not exactly comparable to the present invention but are indicative of the present state of the art.

The calculations are running through the various detection steps as follows. The laser is emitting optical power $P_e = QE \times P_0 = 1.5 \times 10^{-2}$ W, where $P_0 = 3.0 \times 10^{-2}$ W is the total power consumption and QE=0.5 is the laser quantum efficiency. The optical power is emitted from an area $A_s$ (assumed to be 20 $\mu m^2$) and a solid angle $\Omega_s$ (0.01 sr) into the waveguide having the corresponding properties $A_{wg}$, (10 $\mu m^2$), $\Omega_{wg}$ (0.01 sr). Misalignment MA=0.7 is accounted for additional loss. The total loss factor LF1 before optical power is entering the waveguide resonator can be calculated from $$LF1 = \frac{P_{wg}}{P_e} = \frac{A_{wg}}{A_s} \times \frac{\Omega_{wg}}{\Omega_s} \times MA \qquad (2)$$

From eq. (2) the loss factor LF1=0.35, and the coupled power into the waveguide $P_{wg} = 5.3 \times 10^{-3}$ W is obtained. These values are then inserted into Beer-Lambert's equation (3) to obtain the optical power $\Delta P$ absorbed by a concentration $c_m$ of EtOH, corresponding to the desired detection limit of 0.2 ppm according to Table 1, and a modulation of the extinction coefficient $\Delta\varepsilon = 0.9 \times 10^{-4}$ pp$^{-1}$ m$^{-1}$ is included in the expression. The effective length L of the absorption in the waveguide evanescent field is given by eq. (4) with parameters $\lambda_p = 3.345$ $\mu m$, $Q_{wg} = 10^4$, and effective index of refraction $n_{eff} = 1.7$.

$$\Delta P / P_{wg} \approx \Gamma \times \Delta\varepsilon \times C_m \times L \qquad (3)$$

$$L = \frac{\lambda_p \times Q_{wg}}{n_{eff}} \qquad (4)$$

From eq. (3) and (4) the absorbed power $\Delta P = 9.5 \times 10^{-10}$ W is obtained. Two detection options will be considered: (i) using the photodiode 116 to measure a variation of optical power from the waveguide due to absorption; (ii) using the voltage feed circuitry 109, 110 of the laser structure 112 to measure variations of current drawn from a constant voltage source.

The total photocurrent $i_{ph}$ from the photodiode 116, and its variation due to absorption $\Delta i_{ph}$ are calculated from eq. (5), and (6) using the photodiode detectivity $D_{ph} = 5.4$ A/W and the optical coupling factor LF2=$10^{-5}$, from the waveguide to the photodiode. The value of LF2 is selected not to influence $Q_{wg}$ significantly.

$$i_{ph} = D_{ph} \times LF2 \times P_{wg} \qquad (5)$$

$$\Delta i_{ph} = D_{ph} \times LF2 \times \Delta P \qquad (6)$$

Using results from previous equations inserted into eq. (5) and (6) provides the following results: $i_{ph}=2.9\times10^{-7}$ A, and $\Delta i_{ph}=5.1\times10^{-14}$ A. This number may be related to the fundamental shot noise current $i_{nsh}$ according to eq. (6), where $\Delta f$ is the effective bandwidth assumed to be 10 Hz:

$$i_{nsh} - \sqrt{2e \times i_{ph} \times \Delta f} \qquad (7)$$

Using eq. (7) to calculate the resulting current noise $i_{nsh}=0.96\times10^{-12}$ A, and calculating the signal to noise ratio $SNR=\Delta i_{ph}/i_{nsh}=0.053$, it may be concluded that there is a resolution gap of the photocurrent detection option for very low substance concentration.

Equations (8) and (9) may be used for calculation of the corresponding values using the second detection option of measuring current with a variation due to a modulated drive voltage of the laser. The relative current variation $\Delta i/i_0$ due to absorbed optical power $\Delta P/P_0$ is given by eq. (8):

$$\frac{\Delta i}{i_0} = \frac{\Delta P}{P_0} \qquad (8)$$

$$i_{nsh} = \sqrt{2e \times i_0 \times \Delta f} \qquad (9)$$

Assuming a constant operating voltage $u_0=0.4$ V, i e slightly above the laser threshold voltage of 0.371 V, the calculation results are: $i_0=P_0/u_0=3\times10^{-2}/0.4=7.5\times10^{-2}$ A, $\Delta i=2.4\times10^{-9}$ A, $i_{nsh}=4.9\times10^{-10}$, $SNR=\Delta i/i_{nsh}=4.9$.

The noise expressions in each of the detection cases (i) and (ii) corresponding to equations (7) and (9), shot noise dominates over thermal noise given by $(4\ kTG\Delta f/e)^{1/2}$, where $k=1.38\times10^{-23}$ J/K and G is the effective conductive load.

The detection principle of current measurement when using a modulated voltage source 109 thus results in a signal to noise ratio which is almost two orders of magnitude higher than the photocurrent option, fulfilling the resolution limit of 0.2 ppm with good margin.

The embodiments described above are to be understood as illustrative examples of the system and method of the present invention. It will be understood that those skilled in the art that various modifications, combinations and changes may be made to the embodiments also including the above examples. In particular, different part solutions in the different embodiments can be combined in other configurations, where technically possible.

The invention claimed is:

1. A semiconductor gas sensor device for determining the concentration of a volatile substance within air flow, the semiconductor gas sensor device comprising: a laser structure and an optical waveguide resonator formed in a same compound semiconductor, and a means for detecting optical power dissipation of an electromagnetic wave propagating in the optical waveguide resonator, the compound semiconductor comprising a single crystalline substrate and a plurality of epitaxially grown semiconductor single crystalline layers provided on the substrate, wherein the plurality of epitaxially grown semiconductor single crystalline layers comprises at least one optical emission layer and one optical propagation layer, wherein:

the optical emission layer is present at least in the laser structure and is arranged to emit electromagnetic radiation within a specific wavelength band;

the optical waveguide resonator is at least partly constituted by one part of the optical propagation layer and the major portion of the optical waveguide resonator is separated from the remaining part of the optical propagation layer and arranged to resonate in the specific wavelength band; and the laser structure is provided adjacent to a portion of the optical waveguide resonator, thereby providing means for transmitting electromagnetic radiation within the specific wavelength band generated in the optical emission layer of the laser structure to the optical waveguide resonator, wherein the semiconductor gas sensor device comprises a MEMS modulator formed at least partly in the optical propagation layer and arranged to control the position of the specific wavelength band.

2. The semiconductor gas sensor device according to claim 1, wherein the laser structure comprises a laser waveguide which is at least partly formed in or optically coupled to the optical propagation layer and wherein during use the laser waveguide is optically coupled to the optical waveguide resonator.

3. The semiconductor gas sensor device according to claim 1, wherein the semiconductor gas sensor device is arranged to determine a concentration of a specific substance in air and the laser structure is arranged to emit electromagnetic radiation at the specific wavelength band, and the optical waveguide resonator is arranged to resonate at the specific wavelength band associated with a peak in absorbance of that substance.

4. The semiconductor gas sensor device according to claim 1, wherein the laser structure is arranged adjacent to a portion of the optical waveguide resonator with a gap which does not exceed ½ of a wavelength in the specific wavelength band.

5. The semiconductor gas sensor device according to claim 1, wherein the material of the optical propagation layer is selected to be highly transparent in the specific wavelength band.

6. The semiconductor gas sensor device according to claim 1, wherein the optical waveguide resonator is dimensioned so that its circumference $C_r$ will precisely equal an integer N times the desired resonance wavelength $\lambda_r$ corresponding to the absorption peak wavelength of the substance to be detected.

7. The semiconductor gas sensor device according to claim 1, wherein the optical waveguide resonator is a closed-loop structure and/or is ring-formed.

8. The semiconductor gas sensor device according to claim 1, wherein the optical waveguide resonator is a line-formed structure and comprises a first reflector and a second reflector arranged at respective ends of the optical waveguide resonator.

9. The semiconductor gas sensor device according to claim 1, wherein the optical waveguide resonator is provided with at least one straight portion positioned adjacent to the laser structure and the length of the straight portion is at least as long as the extension of the laser structure in the plane of the compound semiconductor, and/or wherein the plurality of layers comprises at least one intermediate layer arranged in between the substrate and the optical propagation layer, the intermediate layer being present beneath the optical propagation layer in the laser structure and the intermediate layer being at least partly absent under the optical propagation layer forming the optical waveguide resonator.

10. The semiconductor gas sensor device according to claim 1, wherein the optical waveguide resonator is partly free hanging over etched-away portions of the intermediate layer and partly supported by remaining structures of the intermediate layer, or wherein the optical waveguide resonator is partly free hanging over etched-away portions of the intermediate layer, and partly supported by a plurality of bridges provided in the optical propagation layer and extending from a base structure to the optical waveguide resonator.

11. The semiconductor gas sensor device according to claim 10, wherein each of the bridges has a width that is less than the shortest wavelength in the specific wavelength band.

12. The semiconductor gas sensor device according to claim 1, wherein the optical waveguide resonator has an essentially rectangular cross section with a width/thickness of approximately 2.0±0.5/0.2±0.1 μm.

13. The semiconductor gas sensor device according to claim 1, wherein the means for detecting optical power dissipation of an electromagnetic wave propagating in the optical waveguide resonator, is provided by the laser structure further comprising means for monitoring and controlling the current and voltage of the laser structure during use, or wherein the means for detecting optical power dissipation of an electromagnetic wave propagating in the optical waveguide resonator, is a photodiode constituted at least partly by the plurality of epitaxially crystal grown layers.

14. The semiconductor gas sensor device according to claim 1, wherein the laser structure is double heterostructure laser or a quantum cascade laser.

15. The semiconductor gas sensor device according to claim 1, further comprising optical feedback gratings formed at least partly in the optical propagation layer.

16. The semiconductor gas sensor device according to claim 1, further comprising a temperature sensor formed at least partly by the plurality of epitaxially crystal grown layers.

17. The semiconductor gas sensor device according to claim 1, configured such that the specific wavelength band at least partly overlaps the position and width of an absorption peak of the substance.

18. A method of determining the concentration of a volatile substance within an air flow, the method comprising:

providing a semiconductor gas sensor device according to claim 1;

providing an air-flow to the immediate surroundings of the semiconductor gas sensor device of the semiconductor gas sensor device;

supplying a drive voltage to the laser structure of the semiconductor gas sensor device; and recording the output from the means for detecting relating to the optical power dissipation of an electromagnetic wave propagating in the optical waveguide resonator being affected by volatile substance within an air flow.

19. The method according to claim 18, wherein the step of recording the output from the means for detecting comprises monitoring and controlling the current and voltage of the laser structure and basing the determination of the concentration of a volatile substance on how the current-voltage characteristic of the laser structure is influenced by the volatile substance within the air-flow.

20. The method according to claim 18, wherein the step of recording the output from the means for detecting comprises monitoring and analyzing the output from a photodiode detecting the optical power dissipation in the optical waveguide resonator.

* * * * *